(12) United States Patent
Ranade et al.

(10) Patent No.: US 7,691,752 B2
(45) Date of Patent: Apr. 6, 2010

(54) METHODS OF FORMING IMPROVED EPI FILL ON NARROW ISOLATION BOUNDED SOURCE/DRAIN REGIONS AND STRUCTURES FORMED THEREBY

(75) Inventors: Pushkar Ranade, Hillsboro, OR (US); Keith Zawadzki, Portland, OR (US); Christopher Auth, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 11/694,458

(22) Filed: Mar. 30, 2007

(65) Prior Publication Data

US 2008/0237742 A1 Oct. 2, 2008

(51) Int. Cl.
*H01L 21/31* (2006.01)
*H01L 21/469* (2006.01)
*H01L 29/04* (2006.01)

(52) U.S. Cl. .................. 438/735; 438/739; 257/627; 257/E21.431; 257/E29.122; 257/E21.619

(58) Field of Classification Search ............. 438/739, 438/733, 735; 257/627, E21.431, E21.619, 257/E21.634, E21.307, E21.312, E21.308, 257/E29, 122, E29.269, E29.136, E29.409
See application file for complete search history.

(56) References Cited

U.S. PATENT DOCUMENTS

| | | | |
|---|---|---|---|
| 6,222,230 B1 * | 4/2001 | Gardner et al. | 257/329 |
| 7,045,407 B2 | 5/2006 | Keating et al. | |
| 7,579,617 B2 * | 8/2009 | Shimamune et al. | 257/19 |
| 2001/0028067 A1 * | 10/2001 | Awano | 257/192 |
| 2003/0021572 A1 * | 1/2003 | Steinberg | 385/137 |
| 2003/0190791 A1 * | 10/2003 | Fischetti et al. | 438/305 |
| 2006/0138398 A1 | 6/2006 | Shimamune et al. | |
| 2008/0001182 A1 * | 1/2008 | Chen et al. | 257/255 |
| 2008/0135894 A1 * | 6/2008 | Bohr et al. | 257/288 |

* cited by examiner

*Primary Examiner*—Caridad M Everhart
(74) *Attorney, Agent, or Firm*—Kathy J. Ortiz

(57) ABSTRACT

Methods and associated structures of forming a microelectronic device are described. Those methods may include plasma etching a portion of a source/drain region of a transistor, and then selectively wet etching the source drain region along a (100) plane to form at least one (111) region in the recessed source/drain region.

12 Claims, 3 Drawing Sheets

METHODS OF FORMING IMPROVED EPI FILL ON NARROW ISOLATION BOUNDED SOURCE/DRAIN REGIONS AND STRUCTURES FORMED THEREBY

BACKGROUND OF THE INVENTION

One concern with the process of forming a microelectronic device, such as a device utilizing transistors, for example, involves the step of filling source/drain regions with epitaxial material, such as with a silicon germanium material. As transistor geometries become smaller, source/drain regions become more narrow with every generation, and therefore more difficult to fill with epitaxial material. Poor epitaxial fill may result in poor yield of transistors during device fabrication.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
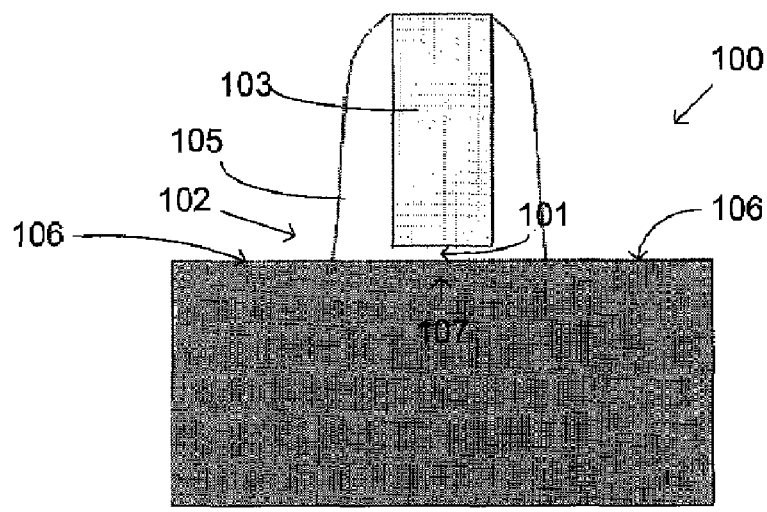
FIGS. 1a-1d represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include plasma etching a portion of a source/drain region of a transistor, and then selectively wet etching the source drain region along a (100) plane to form at least one (111) region in the recessed source/drain region. Methods of the present invention enable the utilization of etch chemistries that may significantly change the geometry of recessed source/drain regions, which enables significantly improved epitaxial filling on isolation bounded source/drain regions, for example.

FIGS. 1a-1d illustrate an embodiment of a method of forming a microelectronic structure, such as a source/drain region of transistor structure, for example. FIG. 1a illustrates a cross-section of a portion of a transistor structure 100. The transistor structure 100 may comprise a gate region 102, that may comprise a gate oxide region 101 and a gate 103. The transistor structure 100 may also comprise a spacer 105 and a channel region 107 located beneath the gate oxide region 101. The transistor structure 100 may further comprise a source/drain region 106, which may be located adjacent at least one side of the gate region 102. The source/drain 106 regions may comprise silicon and/or silicon containing materials.

Figure 1B:
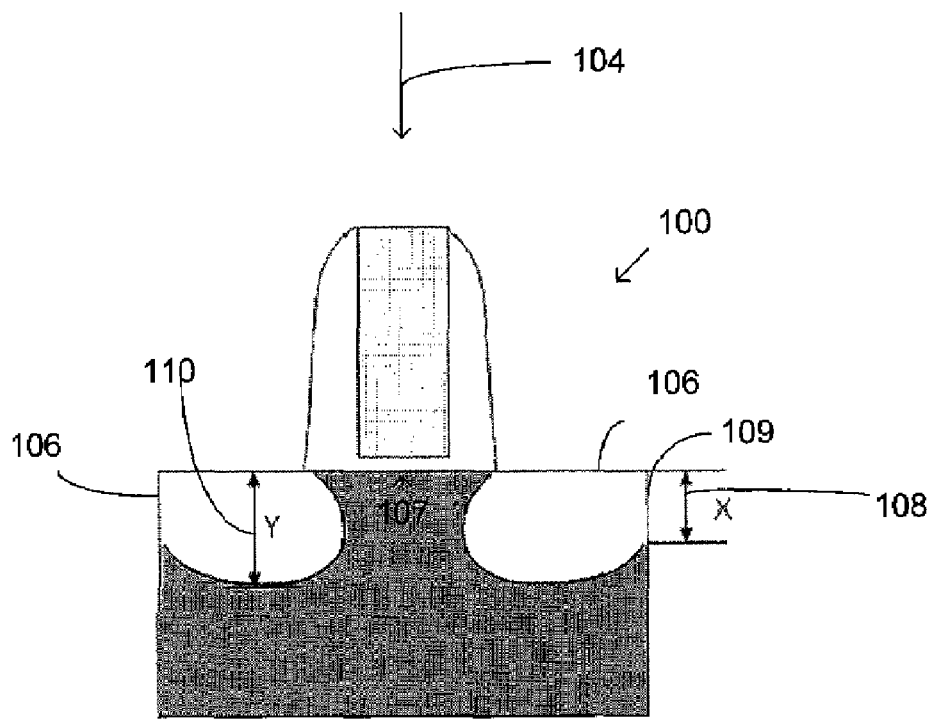

In one embodiment a portion of the source/drain region 106 may be etched utilizing a dry etch process 104 (FIG. 1b). In one embodiment, the source/drain region 106 may be dry etched utilizing a plasma dry etch process for example, as is known in the art. The particular process parameters of the dry etch 104 may vary depending upon the particular application.

In one embodiment, a depth 108 at an isolation edge 109 of the source/drain region 106 may be set by the dry etch process 104. In one embodiment, the depth of the isolation edge depth 109 may comprise between about 500 to about 600 angstroms or less, but will depend upon the particular application. The isolation edge 109 may comprise a region wherein an isolation material 123 (see FIG. 1d, for example), such as an ILD (interlayer dielectric) may be located adjacent to the source drain region 106.

The dry etch process 104 may form an initial recessed depth 110 in the source/drain region 106. The recessed etch depth 110 may be generally located adjacent to the gate region 102, while the isolation edge 109 depth 108 may be located adjacent to the isolation edge 109. In one embodiment, the initial recessed depth 110 may comprise a depth of about 500 to about 600 angstroms, or less, but will depend upon the particular application.

Figure 1C:
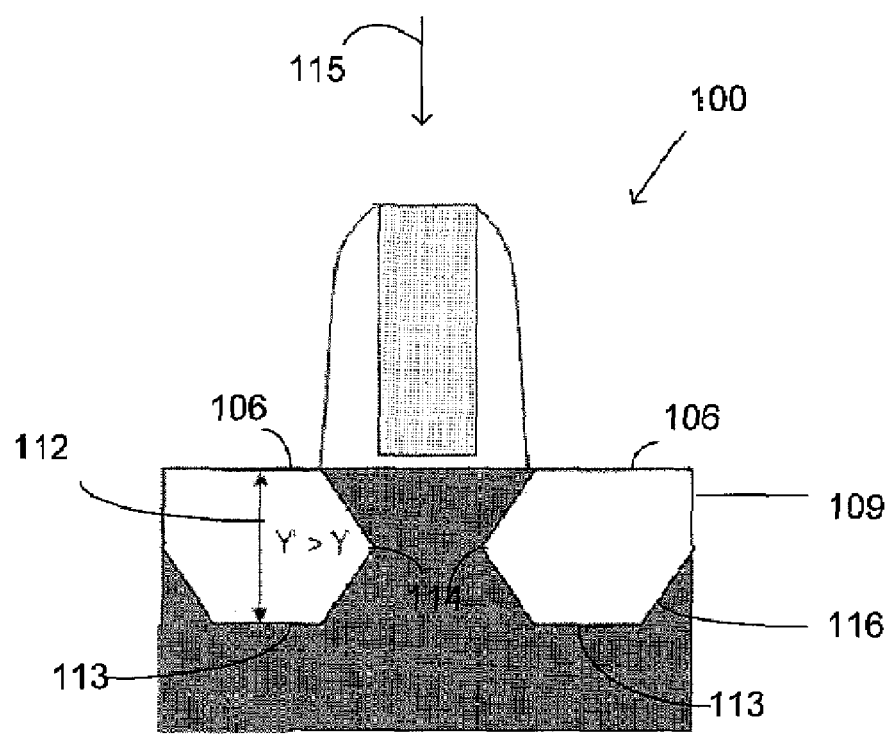

The source/drain region 106 may then be wet etched using a selective wet etch process 115 (FIG. 1c). In one embodiment, the wet etch process 115 may selectively etch the source/drain region 106 along the (100) plane, and then stops on a (111) plane to form at least one (111) region 116 in the recessed source/drain 106 region. In one embodiment, the wet etch process 115 may comprise a hydroxyl (OH) containing species, such as but not limited to potassium hydroxide, TMAH, and sodium hydroxide.

A final recessed depth 112 of the source/drain region 106 can be independently set by the wet etch process 115. A shallower depth of the dry etch will improve epitaxial fill (during subsequent processing) near the isolation edge 109 while a deeper depth of the wet etch (Y') will improve transistor performance by increasing epitaxial material volume filling in the transistor structure 100. The particular process parameters and dimensions of the dry and wet etch may vary depending upon the particular application.

Figure 1D:
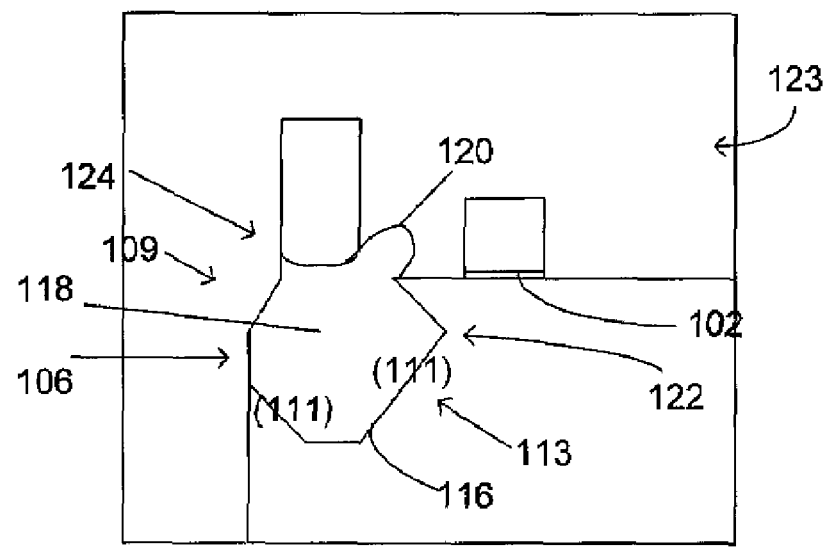

In one embodiment, the wet etch process 115 may create two (111) planes at the bottom 113 of the source/drain region 106. In one embodiment, the wet etch process 115 may form a (111) region along the isolation edge 109 of the transistor structure 100. In one embodiment, an epitaxial material 118 may be formed within the source/drain region 106 (FIG. 1d). In one embodiment, the epitaxial material 118 may comprise a silicon germanium material. Any suitable technique known in the art may be used to grow the epitaxial material 118 in the source/drain region 106. In one embodiment, the epitaxial material 118 may be formed along the (111) plane of the isolation edge 109 of the transistor structure 100.

Without the wet etch process (for example, employing only a dry etch process), significant problems may occur in the etch profile of the selective epitaxial growth due to little to no epitaxial growth on the isolation edge 109 of the transistor 100. Without the wet etch 115 (which produces a (111) silicon plane on the isolation edge) epitaxial growth will likely not occur on the isolation edge 109.

Figure 1E:
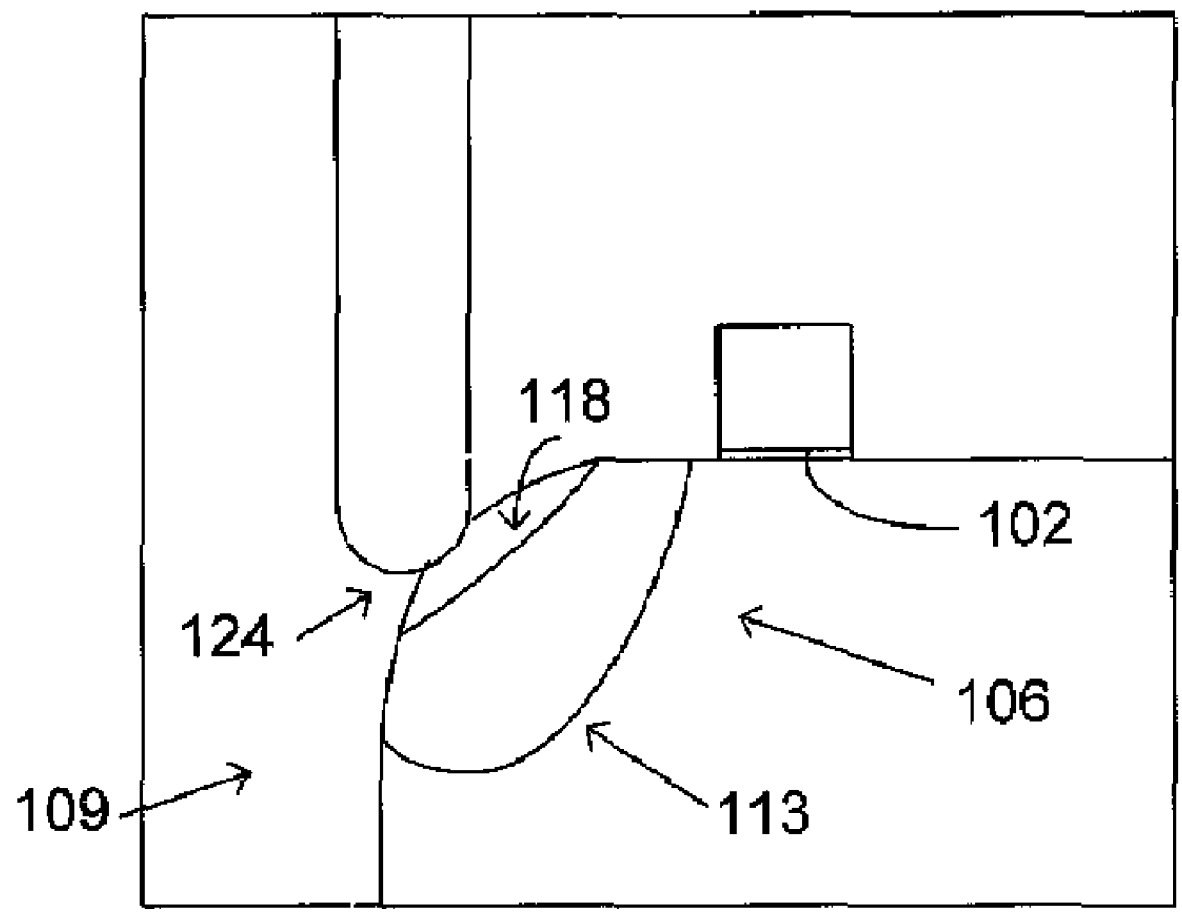
FIG. 1e represents a structure from the Prior Art.

The creation of the (111) plane along the isolation edge 109 results in an improved epitaxial fill of the source/drain region 106. FIG. 1e (Prior Art) shows the difference in epitaxial growth thickness relative to the source/drain 106 bottom 113. The Prior Art etch of FIG. 1e shows the epitaxial fill from the bottom 113 of the isolation edge 109 is very poor. Utilizing the wet etch 115 after performing the dry etch 104 produces a very robust epitaxial fill of the source/drain region 106, as shown in FIG. 1d.

Additionally, a portion of the epitaxial material 118 is raised above the gate region 102 (above the bottom of the gate oxide plane). In one embodiment, the raised portion of the epitaxial material 120 may be raised (comprise a height) by at least about 10 nm, but will depend upon the particular application. The transistor structure 100 of the Prior Art (FIG. 1e) does not typically form a raised portion of the epitaxial material 118. Increasing the depth of the wet etch during the wet etch process 115 increases the performance of the transistor structure 100.

In one embodiment, the a vertex (a meeting point between two (111) planes in the source/drain region 106) may be formed underneath the gate region 102. The vertex 122 may improve electrical performance of the transistor structure 100.

In one embodiment, a contact may be formed on and/or connected to the source/drain region 106 (FIG. 1d). By utilizing the embodiments of the present invention, the contact 124 may be fully landed, in other words, it makes full contact with the epitaxial material 118 of the source/drain region 106. Because the prior art transistor does not typically adequately fill the source/drain region 106, a contact 124 may not fully land on the epitaxial material 118 of the source/drain region 106 (FIG. 1e). In other words, the contact 124 may not make full contact with the epitaxial material 118 of the source/drain region 106, which may result in a reduction in device performance and yield loss during fabrication.

Thus, the benefits of the embodiments of the present invention include, but are not limited to, producing excellent contact to source/drain regions, producing a stressed epitaxial fill which strains the transistor channel, thus improving the mobility of the transistor, and enabling a robust epitaxial fill process, even at very aggressive design rules. Additionally, embodiments of the present invention enable reduction of external resistance of isolation bounded transistors, and reduction of open contacts in isolation bound transistors.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
    dry etching a portion of a source/drain region of a transistor; and
    selectively wet etching the source drain region along the (100) plane to form at least one (111) region in the recessed source/drain region; and
    growing an epitaxial material along the at least one (111) region, wherein a portion of the epitaxial material is raised above a gate region plane, and wherein the epitaxial material fills the source/drain region.

2. The method of claim 1 further comprising wherein a depth of an isolation edge is set by the dry etch.

3. The method of claim 1 further comprising:
    wherein a (111) region is formed along an isolated edge; and growing an epitaxial material on the (111) region formed along the isolation edge.

4. The method of claim 1 further comprising wherein the at least one (111) region form a vertex underneath a gate region.

5. The method of claim 1 further comprising wherein a depth of a recessed edge is set by the wet etch.

6. The method of claim 5 wherein optimizing the depth of at least one of the dry etch and the wet etch improves the electrical performance of the transistor.

7. The method of claim 6 further comprising forming a contact to the filled source/drain region, wherein the contact is fully landed on the source/drain region.

8. A structure comprising:
    a source/drain region of a transistor comprising at least one (111) region, wherein the at least one (111) region forms a vertex underneath a gate region of the transistor; and
    an epitaxial material disposed within the source/drain region, wherein a raised portion of the epitaxial material is disposed above the gate region.

9. The structure of claim 8 wherein the epitaxial material comprises silicon germanium.

10. The structure of claim 8 wherein the epitaxial material is disposed on a (111) plane along an isolation edge region.

11. The structure of claim 8 wherein the raised portion is raised at least about 10 nm above the gate region.

12. The structure of claim 8 further comprising a contact disposed on the source/drain region, wherein the contact is fully landed on the source drain region.

* * * * *